United States Patent [19]

Misic et al.

[11] Patent Number: 4,634,980
[45] Date of Patent: Jan. 6, 1987

[54] NUCLEAR MAGNETIC RESONANCE RADIO FREQUENCY ANTENNA

[75] Inventors: George J. Misic, Hiram; Aarne Lillo, North Royalton; John L. Patrick, Solon; G. Neil Holland, Chagrin Falls, all of Ohio

[73] Assignee: Picker International, Inc., Highland Heights, Ohio

[21] Appl. No.: 641,570

[22] Filed: Aug. 16, 1984

[51] Int. Cl.⁴ ............................................. G01R 33/20
[52] U.S. Cl. .................................... 324/322; 324/318
[58] Field of Search ..................... 324/300, 307–314, 324/318, 322

[56] References Cited

U.S. PATENT DOCUMENTS

| | | | |
|---|---|---|---|
| 4,052,661 | 10/1977 | Higham | 324/322 |
| 4,075,552 | 2/1978 | Traficante | 324/322 |
| 4,379,262 | 4/1983 | Young | 324/309 |
| 4,384,255 | 5/1983 | Young | 324/309 |
| 4,408,162 | 10/1983 | Egger | 324/318 |
| 4,454,474 | 6/1984 | Young | 324/309 |

FOREIGN PATENT DOCUMENTS

| | | | |
|---|---|---|---|
| 56-16854 | 2/1981 | Japan | 324/322 |
| 1329776 | 9/1973 | United Kingdom | 324/318 |

OTHER PUBLICATIONS

Engle, "Broadband Transmit/Receive Circuit for NMR," Rev. Sci. Instrum., 49(9), (Sep. 1978) pp. 1356–1357.
Moores, "VHF Pulsed Magnetic Resonance Duplexers," Rev. Sci. Instrum., vol. 42, No. 9, (Sep. 1971) pp. 1329–1333.

Primary Examiner—Michael J. Tokar
Attorney, Agent, or Firm—Watts, Hoffmann, Fisher & Heinke Co.

[57] ABSTRACT

A nuclear magnetic resonance radio frequency coil. The disclosed coil provides high frequency resonance signals for perturbing a magnetic field within the coil. The coil is impedance matched and tuned with adjustable capacitors. A balanced configuration is achieved with a co-axial cable chosen to phase shift an energization signal coupled to the coil. The preferred coil is a thin metallic foil having a shorting conductor, four wing conductors, and uniquely shaped parallel cross conductors connecting the shorting and wing conductors. When mounted to a rf transmissive plastic substrate and energized the coil produces a homogeneous field within a region of interest the size of a patient head. A semicircular balanced feedbar arrangement is used to minimize undesired field contributions.

6 Claims, 9 Drawing Figures

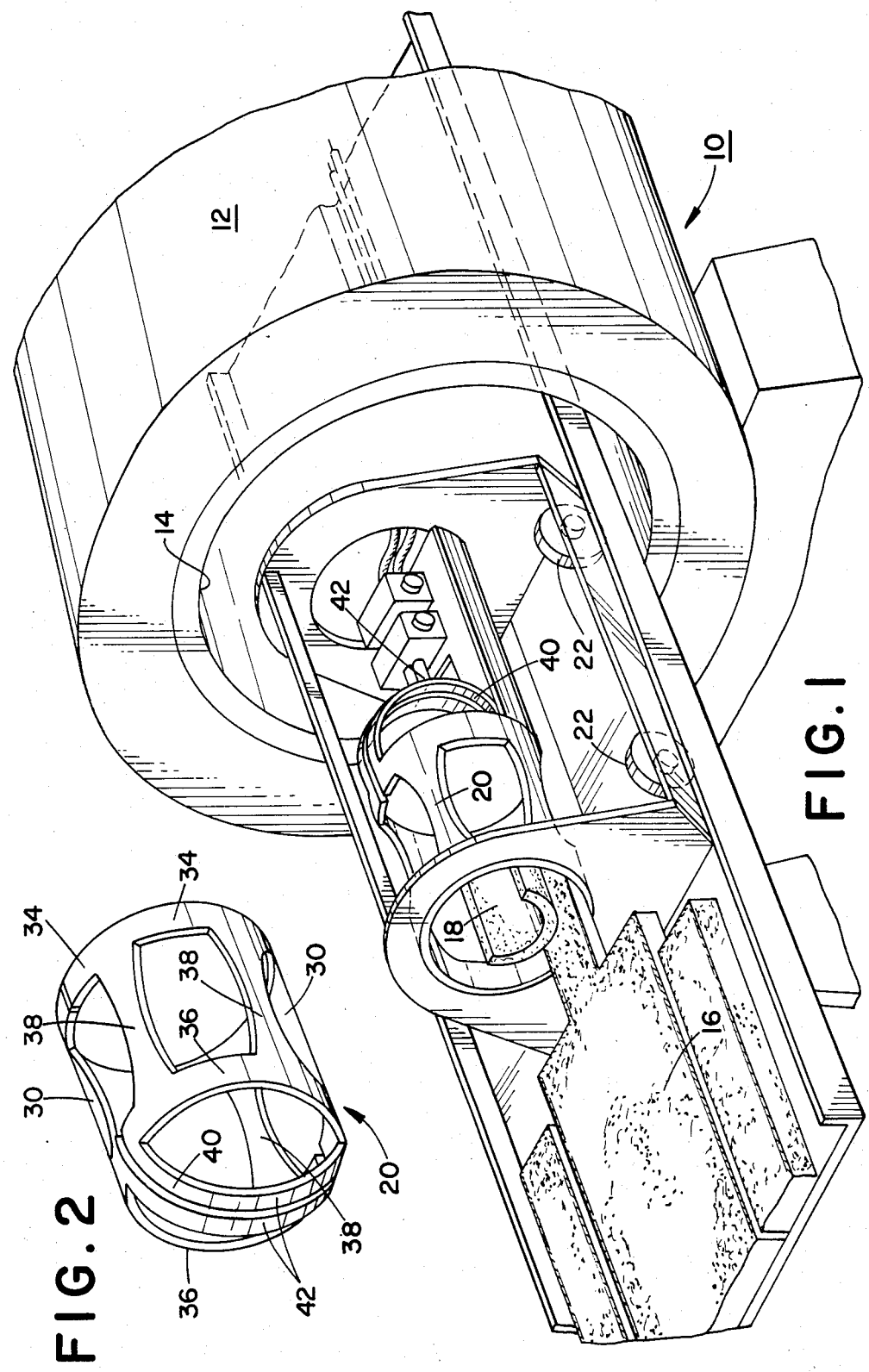

NUCLEAR MAGNETIC RESONANCE RADIO FREQUENCY ANTENNA

TECHNICAL FIELD

The present invention relates to nuclear magnetic resonance imaging and more particularly to an improved resonator for applying radio frequency pulses and receiving low level RF signals over a region of interest.

BACKGROUND ART

In medical applications, nuclear magnetic reasonance (NMR) can indicate variations in the distribution of atomic substances in slices or volumes of interest within a patient. Such variations can be displayed in a way similar to the distributions provided by a computerized tomography system. In a nuclear magnetic resonance examination, magnetic and rf fields rather than X-radiation scan the body. Resonances caused by these fields are detected as induced signals in one or more detector coil systems. The outputs from these coils are then stored and analyzed so that NMR distributions can be displayed.

Techniques for producing these images are well known in the art and disclosed in various printed publications and U.S. patents. Several proposals for apparatus to utilize these procedures are embodied, for example, in U.S. Pat. Nos. 4,454,474 to Young, 4,384,255 to Young et al, and 4,379,262 to Young.

The techniques disclosed in the above mentioned prior art patents involve selection of a planar slice of interest in the body and application of a strong magnetic field gradient in a direction perpendicular to the slice. This field is perturbed in a perpendicular direction in the plane of the slice. The direction of the perturbation is continuously varied by a procedure documented in the literature.

The effect of this perturbation is to introduce a dispersion in nuclear resonance frequencies which return to their original unperturbed state in ways characteristic of the structure within the slice of interest. Repetition of this procedure for different directions can give many signals for each slice of interest which are then used to construct cross-sectional images descriptive of the internal structure of the patient slice.

The radio frequency perturbation excites the nucleii by realigning the macroscopic magnetization or magnetic moment within the cross-section of interest. This radio frequency energization is performed at the Larmor frequency. This frequency is related to a constant descriptive of the nucleii making up the region of interest and the magnetic field gradient imposed during perturbation.

Experience in NMR imaging indicates that the scanning times can be reduced and spacial resolution of NMR images can be increased by increasing this field to higher levels. Since the Larmor frequency of a given nucleii is directly proportional to the field strength, this increase in field strength must be accompanied by higher frequencies for RF energization. In the prior art this energization was accomplished with suitably designed energization coils which generate perturbation fields and in some instances are also used for detecting signals caused by resonances set up within the region of interest.

Transmission and reception of radio frequency signals for NMR imaging requires a resonant radiating structure, often called an rf coil, meeting several criteria. The resonant point of the structure must be high enough to allow proper tuning at the frequency of interest and the structure must have sufficiently high "Q" to provide good signal to noise performance in the receive mode.

Generally, in small volume nuclear magnetic resonance systems an unbalanced feed system and coil configuration is used. A simple reactive element is used as an impedance matching component and a second reactive element is used in parallel with the coil structure to tune the coil to an appropriate frequency.

For large volume nuclear magnetic resonance applications, however, such as a head imaging system a balanced coil system is preferred. This is preferrable since under sample loading the coil system will be less influenced than an asymmetrical system.

As the frequency of operation is raised, however, the effectiveness of a symmetrical matching system is limited by a variety of factors. The reactive components become unmanageably small and are also subjected to extremely high peak voltages. The stray capacitance of the RF coil network eventually makes it impossible to match the network to a useful impedence. In addition to problems in achieving proper energization frequencies, use of larger RF coils creates problems in achieving a uniform magnetic field over the region to be perturbed.

Various prior art proposals to provide new and improved RF energization and detection coils are discussed in the literature. A publication entitled "Slotted Tube Resonator: A new NMR probe head at high observing frequencies" by Schneider and Dullenkopf discusses a resonator for use at high frequencies. This work was the first of a number of similar prior art publications discussing NMR resonator structures. Much of this work, however, has been conducted with extremely small dimensional structures which do not encounter the difficulties encountered when imaging a cross-section of a head. The task of converting a resonator coil for use in small structure analysis into a device suitable for NMR medical imaging is not a straight forward extension of this prior work.

DISCLOSURE OF INVENTION

The invention is particularly suited for NMR imaging of a human head. A resonator having a length and diameter of approximately 30 centimeters is constructed to provide a homogeneous magnetic field in the region of the head that does not unreasonably degrade with sample loading and is easily tuned over a wide frequency range.

An antenna or coil arrangement constructed in accordance with the invention both transmitts and receives high frequency energy in the range of 30 to 95 megahertz. The disclosed resonator includes a cylindrical base of a diameter suitable for enclosing the human head and a metallic foil coupled to the base and forming the antenna structure with a resonant frequency of about 30 to 95 megahertz. The self resonant frequency of the structure is well in excess of 100 megahertz. This resonant structure includes a pair of diametrically opposed arcuate electrical conductors with each conductor subtending an arc of between 75 and 85 degrees. Short circuiting conductors interconnect these conductors at one end and wing strips extend circumferentially from each of the conductors at the other end of the resonator. Energization signals are applied to the resonator through conductive feed strips which interconnect the wing strips.

The arrangement between feed strips, wing strips and conductor strips causes uniform magnetic field within the region of interest, i.e. the head. In a preferred embodiment, the conductor strips are circumferentially spaced parallel conductor strips with each strip increasing in cross-sectional area from its center towards each end. This configuration of the conductor strips enhances the uniformity of the magnetic field while not affecting the tunability of the structure.

An interface circuit is preferably coupled between the disclosed resonator and a standard 50 ohm input cable. The resonator also acts as a pick up coil so that resonances within a patient slice of interest induce electrical signals which are detected, amplified, and utilized in constructing an NMR image. To achieve proper impedance matching and resonance the disclosed resonator is coupled to the 50 ohm input cable through three adjustable capacitors and a half wavelength balun coaxial cable.

The resonator is a quarter wavelength antenna which can be easily tuned and matched in a transmit mode of operation and effectively coupled to a pre-amplifier for generating output signals for use in NMR imaging. From the above it should be appreciated that one object of the invention is a antenna structure suitable for rf signal generation and reception at high frequencies with a geometry large enough for head imaging. Other objects, advantages and features of the invention will become better understood when a detailed description of a preferred embodiment of the invention is described in conjunction with the accompanying drawings.

BRIEF DESCRIPTION OF THE DRAWINGS

FIG. 1 is a perspective view of an NMR imaging station.

FIG. 2 is a perspective view of a resonator probe for providing rf signals in the vicinity of a patient's head.

BEST MODE FOR CARRYING OUT THE INVENTION

Figure 3:
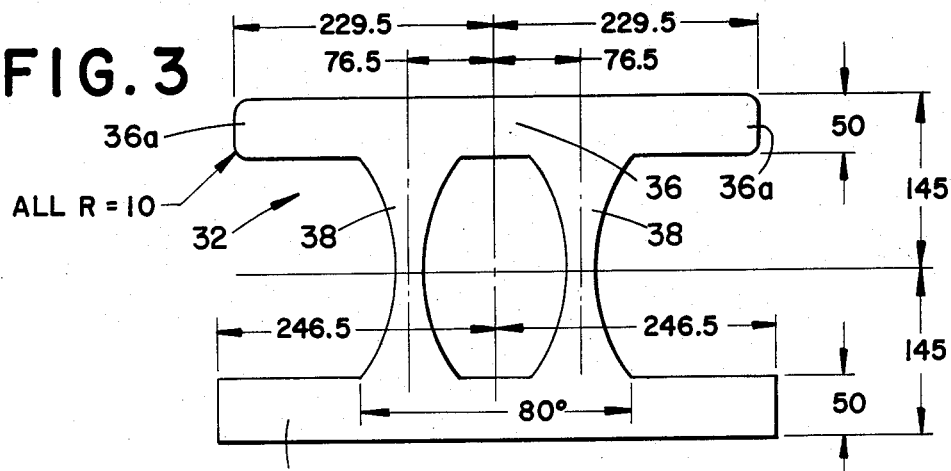
FIG. 3 is a top plan view of a foil configured to form the FIG. 2 resonator.

Turning now to the drawings and in particular FIG. 1, an imaging station for an NMR scanner 10 is disclosed. The scanner 10 includes a large encircling magnet 12 for generating magnetic fields of between 1.5 and 2 Tesla within a patient aperture 14. Shown positioned in proximity to the magnet 12 is a patient couch 16 having a headrest 18. The patient is positioned on the couch in a prone position and then moved into the patient aperture 14 for NMR scanning.

During a head scan a probe coil or resonator 20 is moved on rollers 22 so that the patient's head is positioned within the coil 20. In accordance with techniques well known in the nuclear magnetic resonance imaging art, the magnet 14 is energized to produce a strong magnetic field having a gradient to selectively choose a slice or region of patient interest. With the probe coil 20 encircling the patient's head, the coil is energized with a high frequency (between 30 and 95 megahertz) signal which sets up a time varying magnetic field in the region of interest. Various techniques are known within the art for pulsing the probe coil in ways to produce meaningful resonance information which can be utilized in NMR imaging. The particular configuration of the disclosed coil 20 allows high frequency energization necessary to cause resonance of the spin system at the high magnetic fields generated by the magnet 12. At such high frequencies, the disclosed probe 20 produces uniform magnetic fields which do not exhibit undue Q degradation with sample loading.

Figure 4:
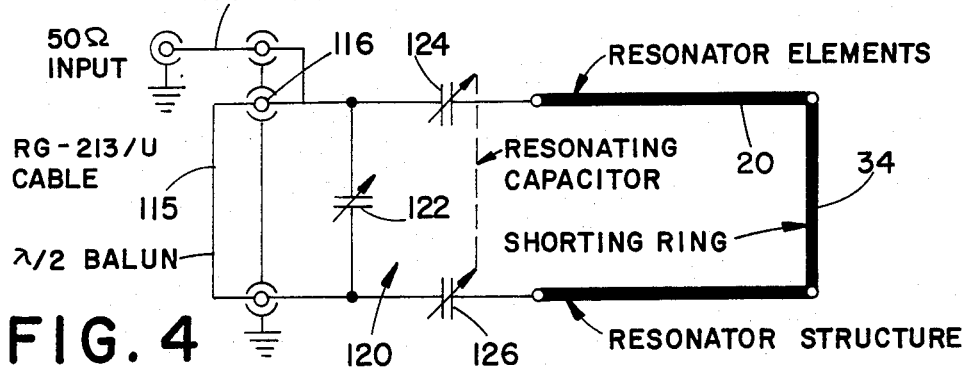
FIG. 4 is a schematic circuit diagram of the resonator showing use of three adjustable capacitors for tuning and impedance matching.

Turning now to FIGS. 2-4, details of the construction of the probe coil are discussed. A cylindrical base 30 formed from an acrylic material forms a surface to which a metallic foil can be affixed. The base 30 has physical dimensions such that a patient's head can be inserted within the base and the probe coil 20 energized in conjunction with generation of the high strength magnetic field. Two copper foil resonator sections 32 having a thickness of 0.0635 millimeter are affixed to an outer surface of the base 30 in a configuration shown in FIG. 2. The foils are self adhesive with a backing layer which is removed prior to application to the base 30. One of the foil sections 32 is shown in plan view prior to mounting to the substrate 30 in FIG. 3. The physical dimensions of this foil are shown in that figure.

The thickness of the foil is chosen to be approximately seven skin depths at the resonant frequency. Use of this thickness causes the resonator 20 to be essentially transparent to the high strength field gradients generated by the magnet 12. This minimizes the generation of eddy currents within the foil by this high strength magnetic field gradient which would be undesirable since the induced eddy currents would produce their own magnetic field in addition to the desired homogeneous rf field.

Each foil segment 32 includes a shorting strip 34 and a wing strip 36. These two strips 34, 36 are interconnected by conductor strips 38 which are parallel to each other and nonuniform in width along their length. Preferably these conductor strips 38 are narrow in the middle and widen as they approach the shorting strip 34 and wing strip 36. As seen most clearly in FIG. 2, when affixed to the outside surface of the substrate 30, the two foil segments 32 contact each other at the ends of the shorting strips 34 and define a 1 cm gap between the ends of the wing strips 36.

Figure 5:
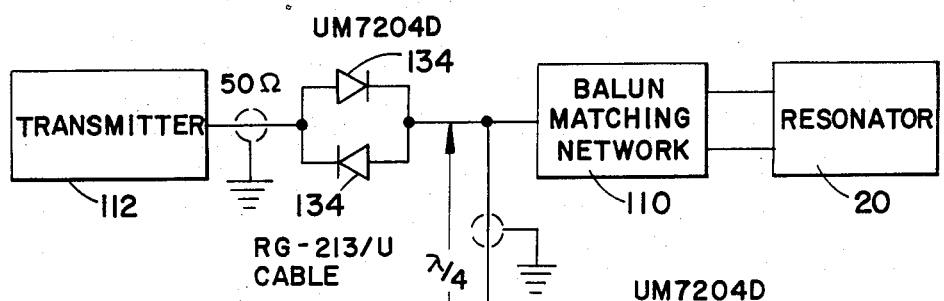
FIG. 5 is a schematic showing an entire NMR probe coil system for both transmitting and receiving resonance signals from within a region of interest.

An end portion 36a of each wing 36 is connected by a feed bar 40 having a midpoint 42 connected to an interface circuit 110 (FIG. 5) by copper strips (not shown). The feed bars both energize the probe and transmit resonance signals generated from within the patient region of interest. The feed bars 40 form a semi-circle 2 cm wide each of the same thickness as the foil and are mounted to an acrylic substrate.

The resonator 20 is energized with a high frequency output from a transmitter 112. A preferred transmitter is available from Amplifier Research under Model No. 2000 ML8 and produces an alternating current voltage a few hundred volts in magnitude. In order to interface the resonator 20 to a standard 50 ohm unbalanced transmission line 114 a half wavelength balun 115 (FIGS. 4 and 5) is utilized. The balun 115 is constructed from 50 ohm coaxial cable, with a velocity factor of 0.80 or 0.66.

The total length of the balun is 1.875 meter using a velocity factor of 0.80 at 64 megahertz. Since the signal traveling in this cable is delayed by one half wavelength the phase of the voltage at one end of the cable is 180° shifted from the other end. Thus, the voltages at each end of the cable are equal in amplitude and opposite in phase. The current at an input node 116 divides equally between the load and the balun phasing line. Thus, the resonator matching network sees a voltage double that of the input voltage, and a current equal to half the applied current. This causes the impedance at the output of the matching network to be four times the input line impedance.

A matching network 120 having three adjustable capacitors 122, 124, 126 is used to tune the resonator 20 and impedance match the high impedance resonator 20 with the 200 ohm balanced input. Model Number CACA 125 vacuum capacitors from ITT Jennings of San Jose, Calif. are preferred. Representative values of these capacitors are 60 picofarads for the parallel capacitor 122 and 12 picofarads for the two series capacitors 124, 126. These values are representative and are tuned to optimize performance of the resonator 20.

To utilize the resonator 20 as both a transmitter and receiver, a multiplex circuit 130 (FIG. 5) couples the resonator and balancing network to both the transmitter 112 and a pre-amplifier 132. The multiplex network includes a plurality of diodes 134 and two quarter wavelength cables 136, 138.

In the transmit mode the large magnitude signals from the transmitter 112 forward bias the diodes 134. The quarter wavelength cable 136 consumes no net power since the cable inverts the terminating impedance and no signal from the transmitter reaches the pre-amplifier 132.

In a receive mode the goal is to couple induced signals in the resonator 20 to the pre-amplifier 132. These signals see a half wavelength cable since the two quarterwave cables 136, 138 act as a single half wave cable.

Figure 6:
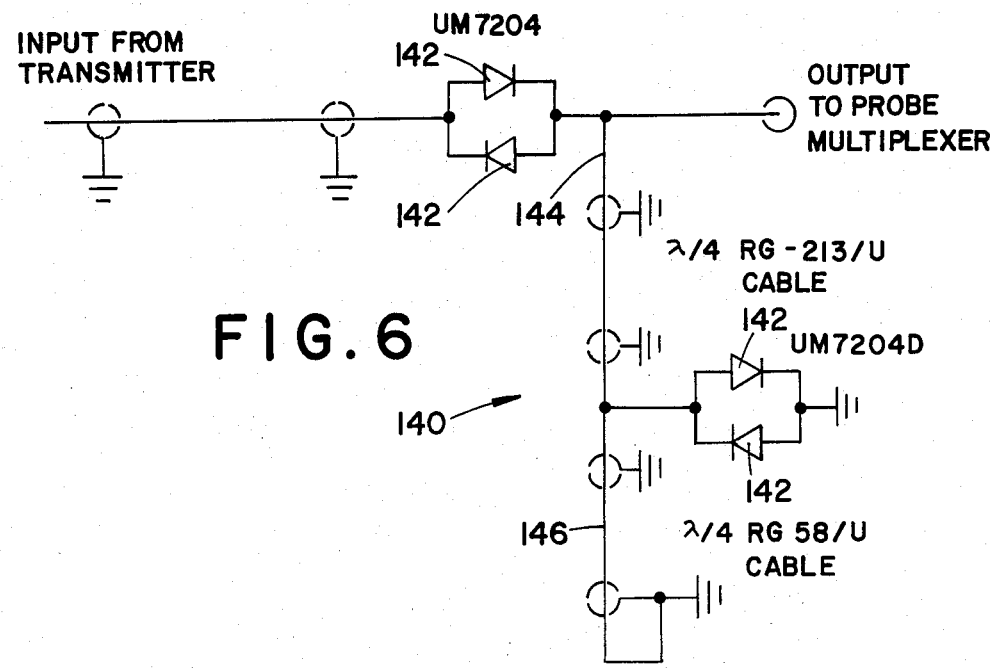
FIG. 6 shows a filter for reducing transmitter noise.

A noise filter circuit 140 (FIG. 6) couples the transmitter 112 to the multiplexer circuit 130 and includes a plurality of diodes 142 and two quarter wavelength cables 144, 146 which function in a way similar to the diodes 134 and cables 136, 138 of the multiplex circuit 130. In the transmit mode the diodes are forward biased, shorting the cable 146 to a quarter wavelength cable 144. No net power is consumed by the cable 144. In a receive mode the two cables 144, 146 act as a single half wavelength cable. Any noise from the transmitter is blocked since the half wavelength cable presents a virtual short.

The pre-amplifier 132 is coupled to other apparatus known in the nuclear magnetic resonating art for converting signals from the resonator into signals suitable for imaging. The resonator 20 has an unloaded "Q" of about 300 and a loaded "Q" of approximately 50. A very good match to the 50 ohm transmission line is achieved with reflected power levels under two percent.

Figure 7:
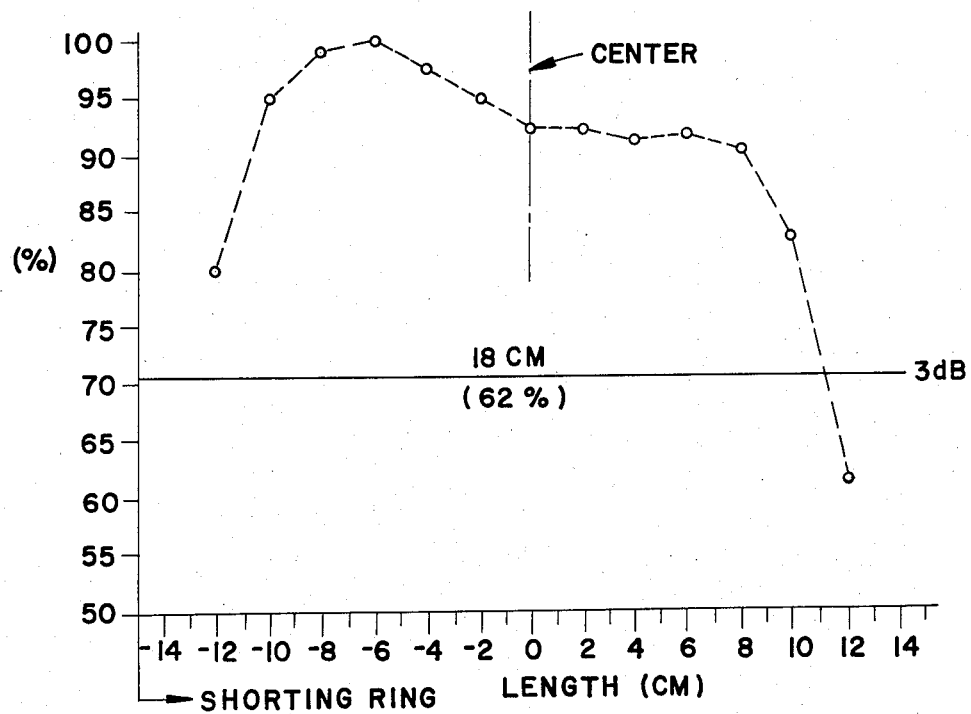
FIGS. 7-9 are graphical representations showing magnetic field uniformity in the region encircled by the antenna.
Figure 8:
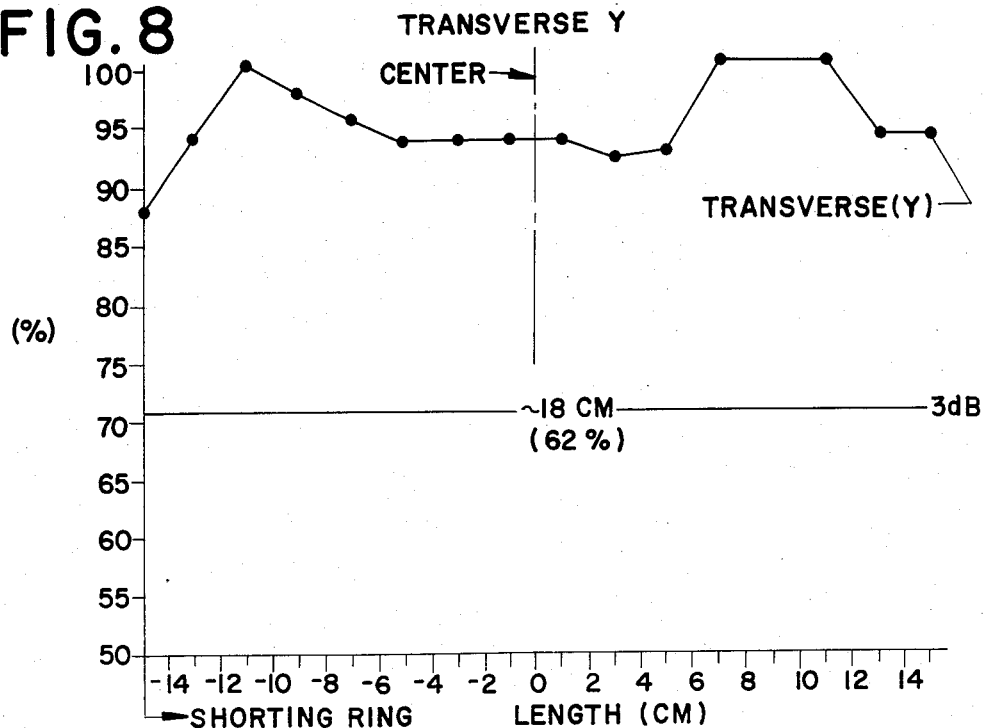
Figure 9:
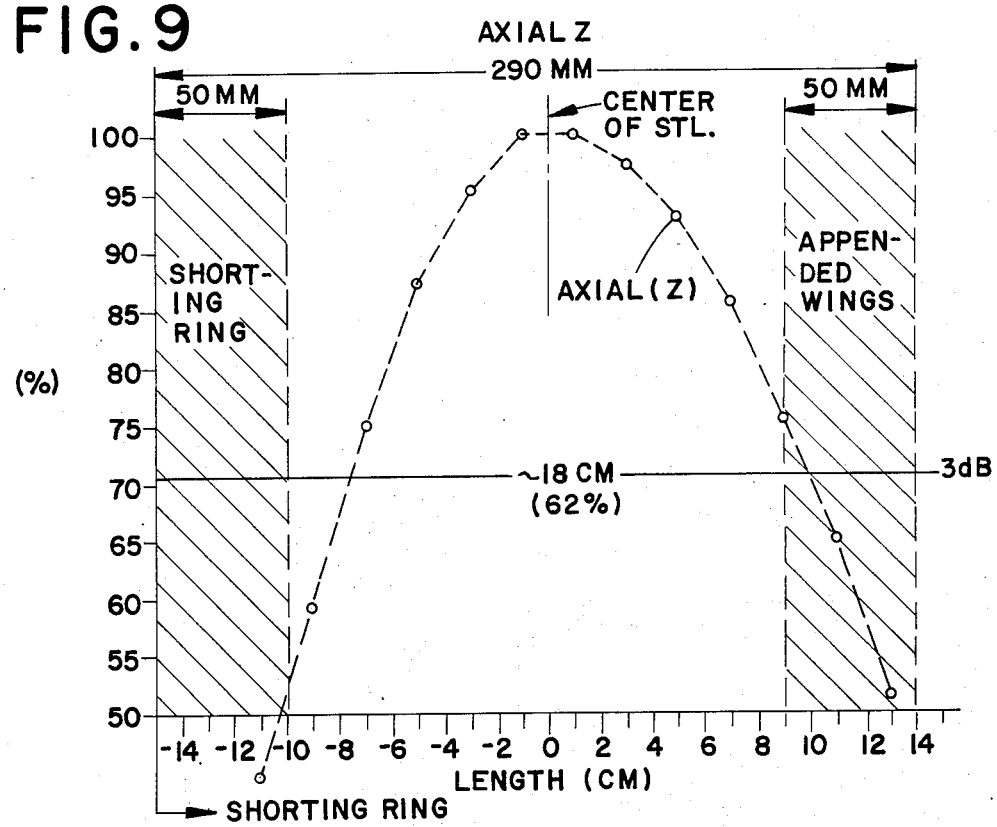

Field uniformity is presented in FIGS. 7-9 where a plot of variations and magnetic field strength with position in the X, Y, and Z directions as defined in FIG. 1 are disclosed. The origin of this co-ordinate axis is a point centered within the resonator 20 halfway between the shorting and wing conductors. The data presented in FIGS. 7-9 was generated with a probe coil energization of 64.5 megahertz, an unloaded "Q" of 260 and a loaded "Q" of 55. The X and Y uniformity in field is excellent and by properly positioning the resonator 20 along the Z axis uniformity within a region of interest as defined by the field gradient of the magnet 12 can be achieved.

The disclosed design fulfills all the requirements for high quality head imaging at field strengths of 1.5 Tesla. The operating parameters of the resonator 20, however, should not be viewed as limiting the invention and field strengths of 2.0 Tesla and resonance frequencies of 85 megahertz are possible. It is the intent that the invention cover all modifications and/or alterations following within the spirit or scope of the appended claims.

We claim:

1. An antenna arrangement for transmitting and receiving high frequency energy in the range of 30 to 95 MHZ for use in NMR patient imaging, comprising an insulating cylindrical base of diameter suitable for enclosing a human head, metallic foil on said base forming an antenna structure having a resonant frequency in the range of 30 to 95 MHZ and including a pair of diametrically opposite arcuate electrical conductors, each conductor subtending a predetermined arc, short circuiting strips interconnecting said conductors at one end thereof, wing strips extending circumferentially from each side of each conductor at the other end thereof, and conductive feed strips interconnecting the wing strips of each conductor and lying in planes transverse to the planes of the wing strips.

2. An antenna arrangement as claimed in claim 1 wherein each of said conductors is configured to enhance the magnetic field generated within the cylinder during use for imaging purposes.

3. An antenna arrangement as claimed in claim 2 wherein each of said conductors is shaped to provide a plurality of circumferentially spaced parallel conductor strips, each strip increasing in cross-sectional area from the center of its length toward, each end.

4. The antenna of claim 1 wherein each conductor subtends 75°-85° of arc.

5. In a nuclear magnetic scanner, field modifying apparatus comprising:
an electrically unbalanced generator for generating a high frequency electrical signal;
an rf signal coil having two balanced inputs coupled to said generator for converting said high frequency electrical signal into a magnetic field over a volume of interest; and
an interface circuit interposed between said generator to said coil to impedance match and tune said coil, said interface including a λ/2 co-axial cable to alter the output impedance and balance to ground the output of said generator coupled across an adjustable capacitive coupling circuit and said two inputs, said cable in combination with said capacitive circuit providing a balanced energization to said two coil inputs.

6. The field modifying apparatus of claim 5 wherein the coil acts as both transmitter and receiver and additionally comprising a multiplexer to send and receive rf signals to and from said coil.

* * * * *